(12) United States Patent
Halbritter

(10) Patent No.: US 11,361,983 B2
(45) Date of Patent: Jun. 14, 2022

(54) METHOD FOR PRODUCING A SEMICONDUCTOR DEVICE AND SEMICONDUCTOR DEVICE

(71) Applicant: Osram Oled GmbH, Regensburg (DE)

(72) Inventor: Hubert Halbritter, Dietfurt-Toeging (DE)

(73) Assignee: OSRAM OLED GmbH, Regensburg (DE)

( * ) Notice: Subject to any disclaimer, the term of this patent is extended or adjusted under 35 U.S.C. 154(b) by 23 days.

(21) Appl. No.: 16/977,823

(22) PCT Filed: Mar. 4, 2019

(86) PCT No.: PCT/EP2019/055331
§ 371 (c)(1),
(2) Date: Sep. 3, 2020

(87) PCT Pub. No.: WO2019/170609
PCT Pub. Date: Sep. 12, 2019

(65) Prior Publication Data
US 2021/0028048 A1  Jan. 28, 2021

(30) Foreign Application Priority Data
Mar. 5, 2018 (DE) ...................... 10 2018 104 936.6

(51) Int. Cl.
*H01L 21/683* (2006.01)
*B41F 16/00* (2006.01)
(Continued)

(52) U.S. Cl.
CPC .......... *H01L 21/6835* (2013.01); *B41F 16/00* (2013.01); *H01L 25/167* (2013.01);
(Continued)

(58) Field of Classification Search
CPC ............... H01L 21/6835; H01L 25/167; H01L 31/02019; H01L 31/02164;
(Continued)

(56) References Cited

U.S. PATENT DOCUMENTS 7,208,337 B2* 4/2007 Eisert ...................... H01L 33/20
257/E33.012
7,972,875 B2* 7/2011 Rogers ................ H01L 27/1214
438/21
(Continued)

FOREIGN PATENT DOCUMENTS

DE      2546253 A1    4/1977
DE  102005061206 A1  4/2007
(Continued)

OTHER PUBLICATIONS

International search report issued for the corresponding PCT application No. PCT/EP2019/055331, dated Mar. 4, 2019, 19 pages (for informational purposes only).

*Primary Examiner* — Vu A Vu
(74) *Attorney, Agent, or Firm* — Viering, Jentschura & Partner Mbb (57) ABSTRACT

A method for producing a semiconductor device may include applying one or more semiconductor components onto a device body where the device body has a substrate and an integrated circuit. The semiconductor component(s) may include an active zone configured to receive radiation. The method may further include transferring a multitude of semiconductor components from a sacrificial wafer to a target wafer with the device bodies still coupled by using a stamp to place them onto said device bodies. The stamp may be pressed onto the semiconductor components to adhere to the semiconductor components to the stamp and transfer them. As soon as the stamp moves in the opposite direction, the semiconductor component(s) may be separated from (Continued)

holding structures by breaking away webs or their projections on the second semiconductor body and leaving a breaking point directly on an outside of the semiconductor component.

12 Claims, 6 Drawing Sheets

(51) Int. Cl.
    *H01L 25/16*     (2006.01)
    *H01L 31/02*     (2006.01)
    *H01L 31/0216*     (2014.01)
    *H01L 31/0232*     (2014.01)
    *H01L 31/173*     (2006.01)
    *H01L 31/18*     (2006.01)

(52) U.S. Cl.
    CPC .. *H01L 31/02019* (2013.01); *H01L 31/02164* (2013.01); *H01L 31/02327* (2013.01); *H01L 31/173* (2013.01); *H01L 31/1892* (2013.01); *H01L 2221/68354* (2013.01); *H01L 2221/68363* (2013.01)

(58) Field of Classification Search
    CPC ............. H01L 31/02327; H01L 31/173; H01L 31/1892; H01L 2221/68354; H01L 2221/68363; H01L 24/75; H01L 24/94; H01L 24/95; H01L 2221/68322; H01L 2221/68368; H01L 2224/75315; H01L 2924/12043; H01L 2924/1433; H01L 31/02162; H01L 31/109; B41F 16/00; G01J 2003/1213; G01J 3/2803; G01J 3/0256
    USPC .......................................................... 257/82
See application file for complete search history.

(56) References Cited

U.S. PATENT DOCUMENTS

| | | | |
|---|---|---|---|
| 9,161,448 B2* | 10/2015 | Menard | ................ H01L 23/481 |
| 2008/0246105 A1 | 10/2008 | Hofer et al. | |
| 2016/0204033 A1 | 7/2016 | Kaempf | |
| 2017/0225945 A1 | 8/2017 | Cok | |
| 2017/0357127 A1* | 12/2017 | Cok | ................ G02F 1/133548 |
| 2018/0303359 A1 | 10/2018 | O'Brien et al. | |

FOREIGN PATENT DOCUMENTS

| | | |
|---|---|---|
| DE | 102015117940 A1 | 4/2017 |
| EP | 2366985 A2 | 9/2011 |
| WO | 2016012409 A2 | 1/2016 |
| WO | 2019076900 A1 | 4/2019 |

* cited by examiner

METHOD FOR PRODUCING A SEMICONDUCTOR DEVICE AND SEMICONDUCTOR DEVICE

CROSS-REFERENCE TO RELATED APPLICATIONS

The present application is a national stage entry according to 35 U.S.C. § 371 of PCT application No.: PCT/EP2019/055331 filed on Mar. 4, 2019; which claims priority to German Patent Application Serial No.: 10 2018 104 936.6 filed on Mar. 5, 2018; all of which are incorporated herein by reference in their entirety and for all purposes.

TECHNICAL FIELD

The invention relates to a method for manufacturing an optical semiconductor device for detecting electromagnetic radiation and to such a semiconductor device.

BACKGROUND

A spectrometer allows the detection of a spectrum. It comprises a multitude of photodetectors, by means of which the radiation in a partial range of the measuring range of the entire spectrometer is detected in each case. Such spectrometers may comprise an array of silicon photodiodes, e.g., with integrated evaluation logic. In order to adjust the wavelength selectivity of the photodiodes, color filters, e.g., in red, green, blue, or even ambient light sensors (ALS) for narrower ranges are used for spectroscopy applications.

DE 102005 061 206 shows a detector arrangement with a microelectronic semiconductor chip.

US 2016/0204033 shows a method for separating substrates and a semiconductor chip.

DE 102015 117 940 shows an optical sensor.

WO 2016/012409 shows a device and a method for micro-transfer printing.

SUMMARY

The object of a non-limiting embodiment is to provide a semiconductor device for a spectrometer application.

Such a semiconductor device comprises: a device body having a substrate and an integrated circuit, and a semiconductor component or a plurality of semiconductor components, wherein the semiconductor component or each of the plurality of semiconductor components comprises an active zone for receiving radiation and a breaking point, is arranged on the device body, and is electrically conductively coupled to the integrated circuit.

The semiconductor component is advantageously a chip which, in unhoused form, is also commonly referred to as "die". The semiconductor components can be photodiodes or photodetectors by means of which the radiation in the active zone is detected and a current or voltage is provided as a function of this radiation. The radiation is advantageously light, whether in the infrared, visible, and/or ultraviolet range.

Each semiconductor component comprises a sensitive spectral range. This is the wavelength range in which radiation is detected. A current or a voltage is provided as a function of the detected radiation. The sensitive spectral range may have a wavelength-dependent relative sensitivity at which different wavelengths of the same intensity generate different high voltages or currents. Typically, the sensitive spectral range has a bell-shaped sensitivity over the wavelength. Semiconductor components can be microphotodiodes, i.e., photodiodes with a small spatial extent, which are applied to the device body. A spectrometer can be formed by combining several semiconductor components of different sensitive spectral ranges. This can be realized by highly integrated photodiodes with a narrow sensitive spectral range as semiconductor components, which are optionally arranged in photodiode arrays on the device body.

The device body comprises integrated circuit structures which can be electrically conductively coupled to the microphotodiodes. Such a device body may also be referred to as a smart substrate. It is made of silicon, for example.

The semiconductor component or the plurality of semiconductor components was advantageously applied to the device body by means of micro-transfer printing.

A corresponding method for producing a semiconductor device provides for: applying a semiconductor component or a plurality of semiconductor components by means of micro-transfer printing to a device body having a substrate and an integrated circuit, wherein the semiconductor component or each of the plurality of semiconductor components comprises an active zone for receiving radiation. This method allows the integration and mounting of microphotodiode structures on a smart substrate.

Micro-transfer printing is a parallel assembly process in which several semiconductor components are simultaneously transferred onto device bodies still coupled to one another in the wafer composite. The semiconductor components to be transferred are broken out of a sacrificial wafer upon contact with a stamp and, after transfer, deposited on a target wafer which is later singulated into the assembled device bodies. The breaking points on the semiconductor components originate from this step. Micro-transfer printing reduces costs in comparison to serial assembly. The semiconductor components may comprise a web-shaped extension with the breaking point at its end.

In one embodiment, the plurality of semiconductor components comprises at least one semiconductor component the sensitive spectral range of which is different from that of another semiconductor component of the plurality of semiconductor components. The arrangement of several semiconductor components with different sensitive spectral ranges on the same device body makes it possible to form a semiconductor device which serves as spectrometer.

Bandgap engineering combines various means for adjusting the sensitive spectral range of a semiconductor component to the desired range. One of these is the specific selection and combination of semiconductor materials for the semiconductor component. A customized bandwidth design enables the production of very narrow-band photodiode structures as semiconductor components.

In one embodiment, the plurality of semiconductor components comprises at least one semiconductor component, the semiconductor material system of which differs from that of another semiconductor component of the plurality of semiconductor components. The use of different material systems allows semiconductor components having different sensitive spectral ranges to be formed. Several semiconductor components having different material systems can be arranged on the same device body. Advantageously, the different material systems comprise at least one from the group comprising silicon, germanium, III-V compounds, and II-IV compounds. The individual microphotodiodes can be realized in a corresponding technology, e.g., Si, Ge, III-V, or II-IV technology. By using and mounting different material systems, the wavelength range typical of silicon can be significantly expanded up to approximately 1000/1100 nm.

Likewise, by using materials other than silicon, a significantly higher absorbance with a thin layer thickness can be achieved.

Furthermore, a means which absorbs in a given wavelength range and which is arranged on the semiconductor component or the plurality of semiconductor components may be provided. Such a means is, for example, a material layer on the radiation incidence side of the semiconductor component, which absorbs radiation in a specific wavelength range so that the semiconductor component no longer detects in this wavelength range. The sensitive spectral range resulting from the material system used can thereby be made even narrower.

By combining various microphotodiodes having different absorbance wavelengths, a broadband but selective detector array can be realized on a hybrid chip in order to enable a broadband spectrometer application. In addition, high-precision mounting and high packing density can be realized by using microphotodiodes.

The device body is designed to further process the detected radiation by means of the integrated circuit. It may, for example, comprise a transimpedance amplifier or an evaluation unit.

In one embodiment, the semiconductor device furthermore comprises a diffuser or a refractive means arranged on the semiconductor component or the plurality of semiconductor components. The diffuser ensures homogeneous illumination of the semiconductor components arranged thereunder.

In one embodiment of the semiconductor device, the plurality of semiconductor components is arranged in an array of cells. Each cell comprises several semiconductor components. The combination of the various types of semiconductor components is the same for each cell.

In one embodiment of the semiconductor device, it furthermore comprises at least one active zone for generating radiation so that radiation-emitting and radiation-detecting semiconductor components are, for example, arranged on the same device body in order to combine them into a system, e.g., made of RGB LEDs and sensors. The semiconductor body comprises a radiation-emitting semiconductor component or a plurality of radiation-emitting semiconductor components, wherein the radiation-emitting semiconductor component or each of the plurality of radiation-emitting semiconductor components comprises an active zone for generating radiation and a breaking point, is arranged on the substrate, and is electrically conductively coupled to the device body. Alternatively, it is also conceivable to provide the active zone for generating radiation on the device body.

Overall, the above-described semiconductor device as a microphotodiode-based spectrometer allows higher integration density on a device level, enables cost reduction and a broader bandwidth of the heterointegration as spectrometer application in comparison to integration of several components based only on silicon or germanium. In comparison to a conventional spectrometer arrangement of silicon photodiodes with filters, better suppression by targeted bandgap engineering is achieved by such a semiconductor device as described above. The result is a better angular reception characteristic, and a broader wavelength range, e.g., more than 1000 nm, can be covered.

BRIEF DESCRIPTION OF THE FIGURES

Non-limiting embodiments are illustrated below with reference to the drawing in the following figures.

Identical, similar or equivalently functioning elements are labelled with identical reference signs in the figures. The figures are all schematic representations and therefore not necessarily true to scale. Rather, comparatively small elements and, in particular, layer thicknesses can be displayed excessively large for clarity.

DETAILED DESCRIPTION

Figure 1:
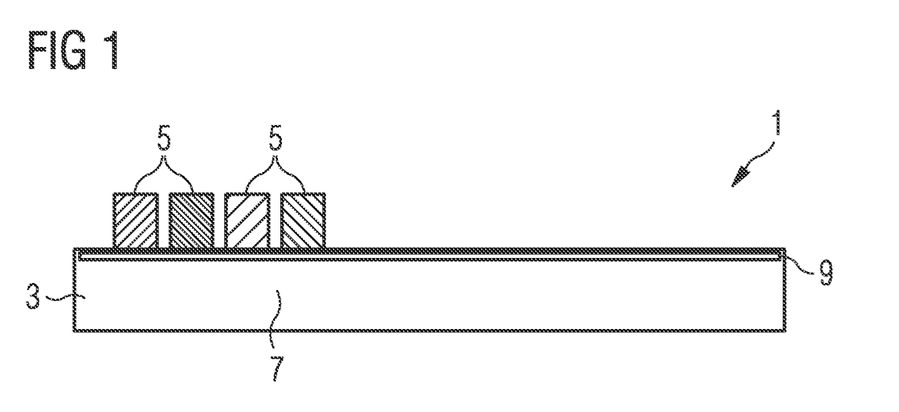
FIG. 1 schematically shows an exemplary embodiment of a semiconductor device in sectional view.

FIG. 1 schematically shows an exemplary embodiment of a semiconductor device in sectional view.

The semiconductor device 1 comprises a device body 3 and a plurality of semiconductor components 5 arranged on the device body 3.

The device body 3 comprises a substrate 7 with an integrated circuit 9. In this exemplary embodiment, it is embodied as an application-specific integrated circuit (ASIC) on a silicon substrate, Si ASIC for short. Such a device body 3 may comprise a logic gate. It can serve as transimpedance amplifier or evaluation unit or provide functions of such assemblies. The integrated circuit is electrically conductively coupled to the semiconductor components 5.

Each of the plurality of semiconductor components 5 comprises an active zone for receiving radiation so that it is suitable as a photodetector. The semiconductor component 5 can be designed as a photodiode of small size and thickness, which is also referred to as a microphotodiode, "µPD" for short.

The plurality of semiconductor components 5 comprises various types of semiconductor components 5; in this exemplary embodiment, four are illustrated by way of example. One exemplary embodiment of photodiodes are metal-semiconductor-metal photodiodes of small size and thickness, referred to as "µMSM" for short. The photodetecting structures that can be used as semiconductor components are not limited to the above-described exemplary embodiments. The types of semiconductor components 5 differ in the wavelength range in which they detect radiation. In other words: The semiconductor components 5 differ in their sensitive spectral ranges so that the combination of various semiconductor components 5 makes it possible to form a spectrometer as a semiconductor device, the measuring range of which results from the superposition of the sensitive spectral ranges.

In this exemplary embodiment, the semiconductor components 5 are printable microphotodiodes which were applied to the first semiconductor body by means of microtransfer printing.

The production of the semiconductor device 1 from a device body 3 and the semiconductor components 5 by means of this method is explained below with reference to FIGS. 2A and 2B.

The production of the device body 3 takes place for a multitude of device bodies 3 simultaneously and in the wafer composite. This form of production allows process steps for the production of the multitude of device bodies 3 to be carried out in parallel in all device bodies 3 simultaneously as long as they are still coupled to one another. Such process steps comprise in particular the application or growth of layers and structures, and also their partial removal if necessary, in order to form the integrated circuit 9. The first semiconductor bodies 3 are singulated and separated from one another only in a final step.

Within the framework of the production, the semiconductor components 5 are placed onto the device bodies 3 and coupled to one another in a parallel assembly process as long as said device bodies are still in the composite. This assembly takes place simultaneously by transferring by means of an elastomer stamp a multitude of semiconductor components 5 from a sacrificial wafer 52 to the target wafer 54 with the device bodies 3 still coupled and placing them onto said device bodies in such a way that the semiconductor components 5 are located at their intended positions on the device bodies 3. The stamp plate comprises a structure corresponding with the size and positions of the semiconductor components 5 on the target wafer 54.

The semiconductor components 5 are likewise produced in parallel in the wafer composite. The corresponding wafer is referred to as sacrificial wafer 52. In this case, however, the second semiconductor bodies 5 are not singulated by separating the wafer 52. Rather, the second semiconductor bodies 5 are simultaneously produced on a sacrificial layer in such a way that all later semiconductor components 5 are coupled to one another via holding structures 30. The sacrificial layer is then removed so that the individual second semiconductor bodies 5 are only coupled to one another and to the wafer substrate via the holding structures 30, wherein free-standing webs 32 coupled the semiconductor components 5 to an anchor structure 34 which in turn is coupled to the wafer substrate. The semiconductor components 5 produced in this way are arranged in a grid shape in the composite.

The thickness of chips produced in this way as semiconductor components 5 can be significantly lower than in the case of conventionally singulated chips and can be in the range of a few micrometers.

During parallel transfer, the stamp is pressed onto the semiconductor components 5 to be transferred so that they adhere to the stamp. As soon as the stamp moves in the opposite direction, the semiconductor components 5 are separated from the holding structures 30 by the webs 32 or their projection on the second semiconductor body 2 breaking away. A breaking point 40 remains on the semiconductor component 5 and may be located on a web-shaped extension 38 which is part of the web 32 of the holding structure 30.

Figure 2A:
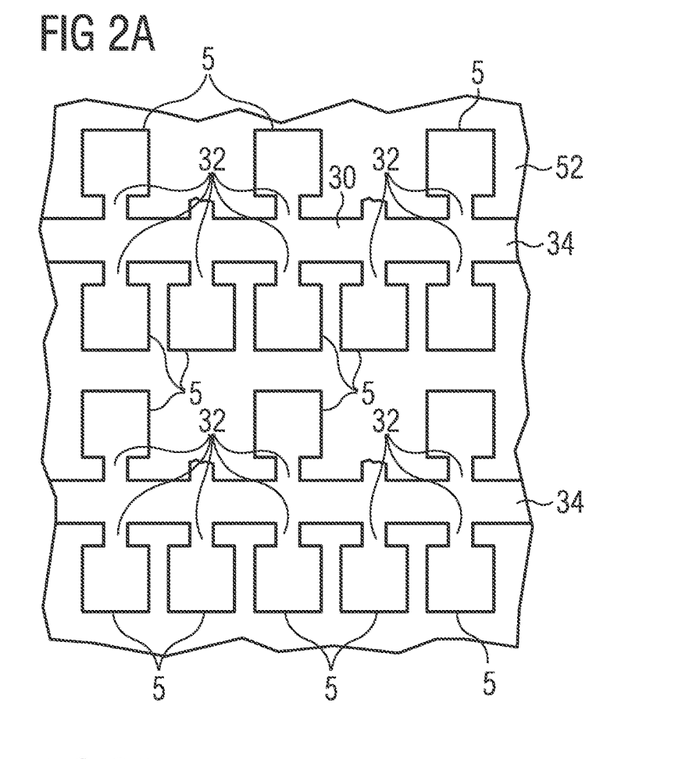
FIGS. 2A and 2B illustrate steps in micro-transfer printing on the basis of intermediates.
Figure 2B:
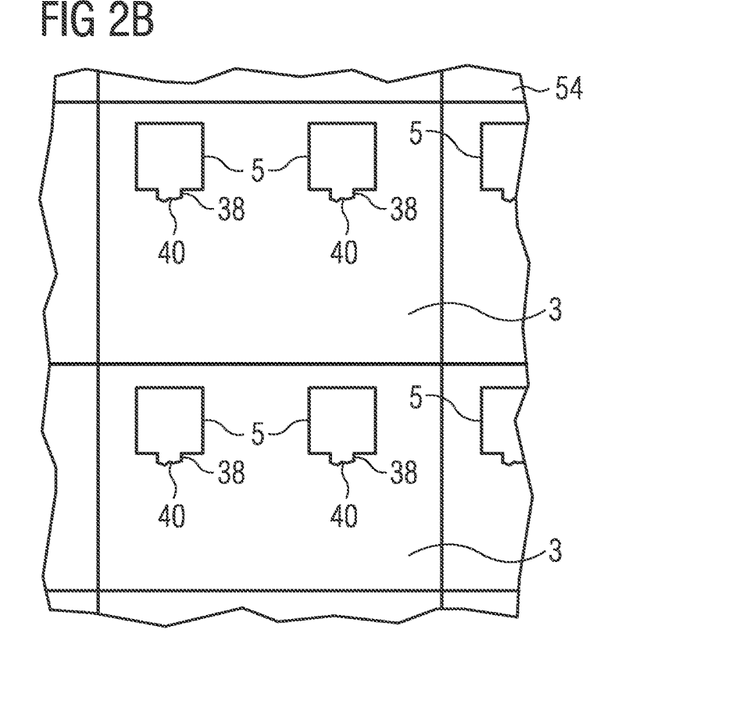

FIG. 2A shows a schematic illustration of the sacrificial wafer 52 with a multitude of second semiconductor bodies 5 and the holding structure 30. After removal of the sacrificial layer, the second semiconductor bodies 5 are freestanding and coupled only via webs 32 to an anchor structure 34 which forms the connection between the holding structure 30 and the wafer substrate. FIG. 2B shows a schematic representation of the target wafer 54 with a multitude of first semiconductor bodies 3 in the composite. Onto each of the first semiconductor bodies 3 have already been placed two second semiconductor bodies 5, which in a manner corresponding to their position on the target wafer 54 were detached from the sacrificial wafer 52 and transferred to the target wafer 54 by means of the stamp.

In the case of the detached second semiconductor body 5, the breaking point 40 is located on a web-shaped extension 38 which is part of the original web 32. Alternatively, the breaking point 40 may also be located directly on an outside of the semiconductor component 5.

In the parallel assembly process, a multitude of semiconductor components 5 is simultaneously transferred by breaking them out of the sacrificial wafer 52 upon contact with the stamp and depositing them on the target wafer 54 after transfer. Further process steps may then be carried out at the wafer level.

The parallel transfer reduces the costs in comparison to serial assembly. The parallel assembly process described above is also referred to as micro-transfer printing. The use of printable microphotodiodes as semiconductor components 5 makes it possible to achieve a high packing density during the wafer-level assembly.

Figure 3:
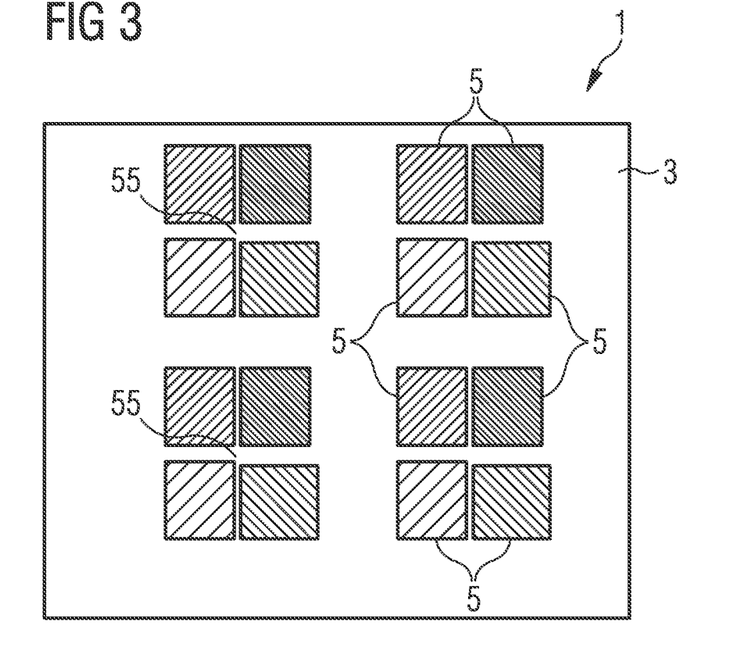
FIG. 3 schematically shows a further exemplary embodiment of a semiconductor device in plan view.

FIG. 3 schematically shows a further exemplary embodiment of a semiconductor device in plan view.

The semiconductor device 1 comprises a plurality of semiconductor components 5 on a device body 3 as described, for example, in connection with FIG. 1.

The semiconductor components 5 are arranged in unit cells 55 arranged in an array of rows and columns. Each unit cell 55 comprises the same types of semiconductor components 5 in a predetermined arrangement with respect to one another. In this exemplary embodiment, a unit cell 55 comprises four different types of semiconductor components 5 arranged in two columns and two rows as a detector array or unit cell array.

The unit cells 55 are also arranged in an array. FIG. 3 shows by way of example four cells 55 in two columns and two rows. The unit cell array can be replicated on the smart substrate 7 for the purpose of better mixing.

The types of semiconductor components 5 in each unit cell 5 differ in their reception characteristics. The superposition of the sensitive spectral ranges of the semiconductor components 5 in the cell 5 results in their measuring range.

The types of semiconductor components 5 may be formed from different material systems, e.g., silicon, germanium, indium phosphide, a III-V compound, or a II-IV compound.

The combination of various material systems for the semiconductor components 5 in the same semiconductor device 1 enables numerous degrees of freedom in adjusting the sensitive spectral ranges for the various semiconductor components 5. In addition, the sensitive spectral range can be further influenced by bandgap engineering so that only a narrow wavelength range is detected by means of a semiconductor component 5. The combinations of various narrow sensitive spectral ranges allow the construction of an efficient spectrometer semiconductor device with very good measurement accuracy.

An alternative or additional means of forming different sensitive spectral ranges is the at least partial use of color filters applied to at least some of the semiconductor components 5.

The array of unit cells 55 allows for spatial resolution in detection since each cell 5 is suitable for detecting the spectrum of light incident in its range. Alternatively, it is possible to achieve better mixing of the incident light by using several cells 55 instead of only a few large-area photodiodes for various wavelengths since the detection of only local maxima or minima is avoided by averaging over several cells 55.

Figure 4:
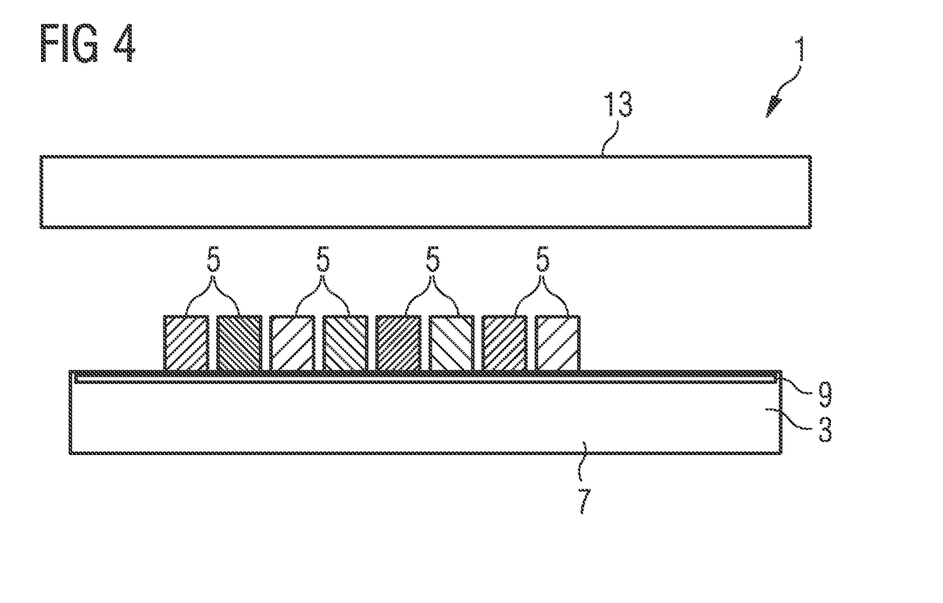
FIG. 4 schematically shows a further exemplary embodiment of a semiconductor device in sectional view.

FIG. 4 schematically shows a further exemplary embodiment of a semiconductor device in sectional view. In order to avoid repetitions, only the differences from the exemplary embodiment shown in FIG. 1 are described.

The semiconductor device 1 comprises a device body 3 and a plurality of semiconductor components 5. In this exemplary embodiment, eight different types of microphotodiodes, the sensitive spectral ranges of which differ, are provided as semiconductor components 5.

A diffuser optical system 13 is provided on the semiconductor components 5 and enables a more homogeneous illumination of the various types of microphotodiodes as semiconductor components 5 and thus increases the detection accuracy.

It should be noted that the various types of semiconductor components 5 below the diffuser optical system 13 may also be arranged in an array of unit cells 55 as described above.

Figure 5:
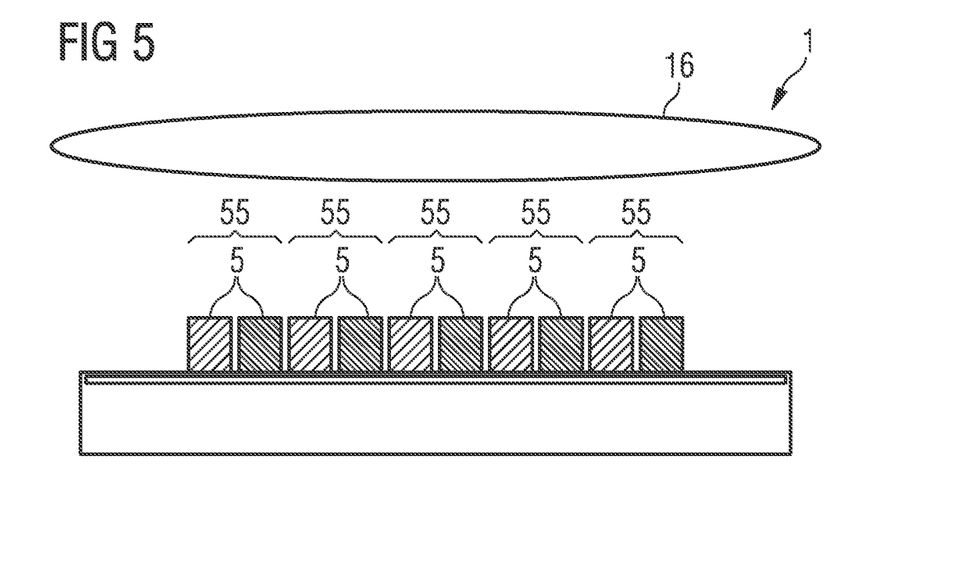
FIG. 5 schematically shows a further exemplary embodiment of a semiconductor device in sectional view.

FIG. 5 schematically shows a further exemplary embodiment of a semiconductor device 1 in sectional view. In order to avoid repetitions, only the differences from the exemplary embodiment shown in FIG. 1 are described.

In this exemplary embodiment, the plurality of semiconductor components 5 comprises replicating detector cells 55 having semiconductor bodies 5 of two types. On the semiconductor components 5 is provided an imaging optical system 16 which has the effect of a lens and directs the incident light onto the semiconductor components 5. The spatial resolution by the plurality of cells makes it possible to detect the direction of the incident light. This arrangement uses various types of microphotodiodes (as opposed to LIDAR or ToF applications with identical microphotodiodes).

It should be noted that the various types of semiconductor components 5 below the optical system 16 may also be arranged in an array of cells 55 having rows and columns as previously described.

Figure 6A:
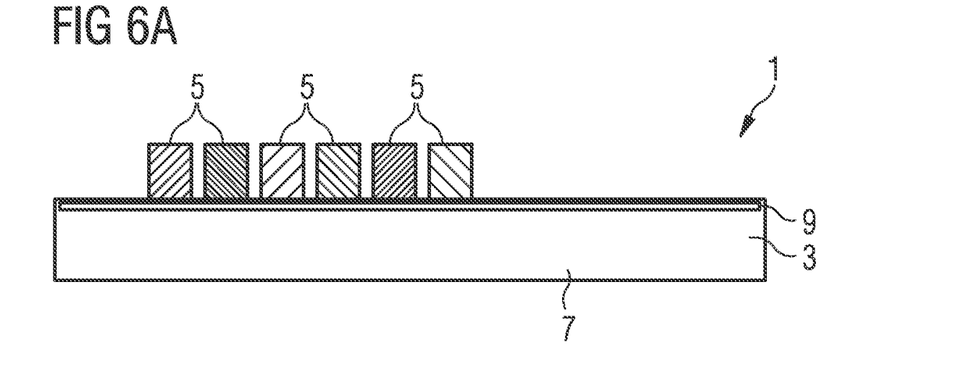
FIG. 6A schematically shows a further exemplary embodiment of a semiconductor device in sectional view.
Figure 6B:
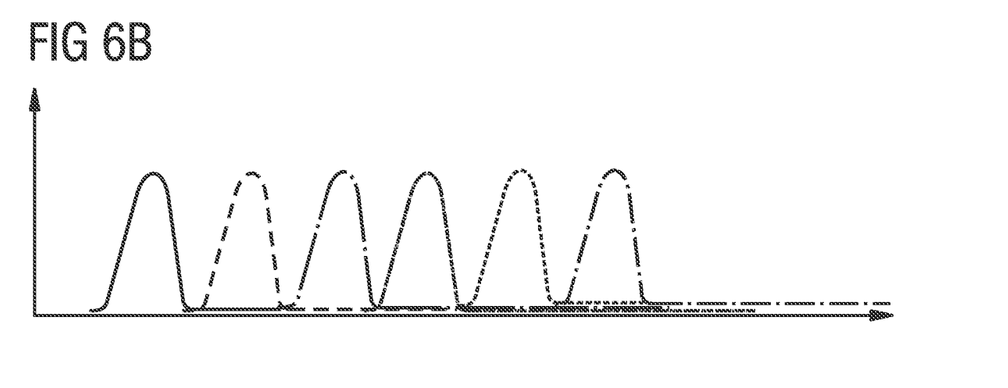
FIGS. 6B and 6C illustrate the filtering effect of the exemplary embodiment of a semiconductor device.
Figure 6C:
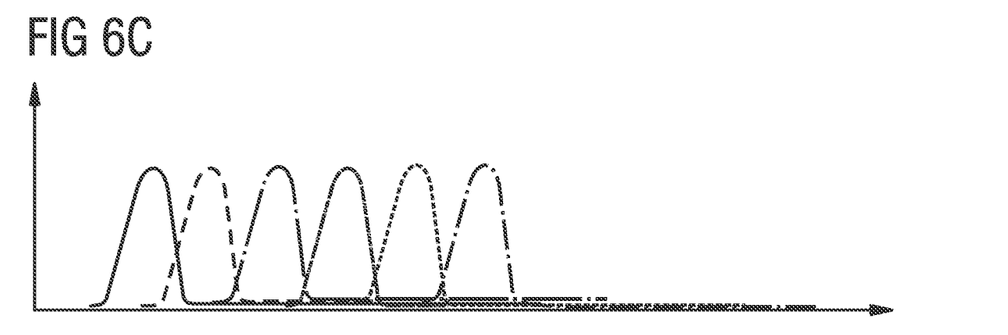

FIGS. 6A, 6B, and 6C illustrate the filtering effect of an exemplary embodiment of a semiconductor device 1 having various microphotodiodes as semiconductor components 5, as shown in FIG. 1. However, six different types of semiconductor components 5 are illustrated by way of example in this exemplary embodiment in FIG. 6A. More or fewer types as well as their arrangement in an array of cells are conceivable. The filtering effect of the other previously described exemplary embodiments follows the same principle.

FIG. 6B shows by way of example the sensitivity of the microphotodiodes as semiconductor components 55 over the wavelength. Each of the microphotodiodes shown in FIG. 6A detects in a wavelength range different from that of the others, but the combination of the various microphotodiodes and the superposition of their sensitive spectra covers the entire spectrum in which detection is to take place. In this exemplary embodiment, the spectra do not overlap.

FIG. 6C shows by way of example the sensitivity of the microphotodiodes over the wavelength in an exemplary embodiment different from the previous one in that the spectra at least partially overlap.

Figure 7:
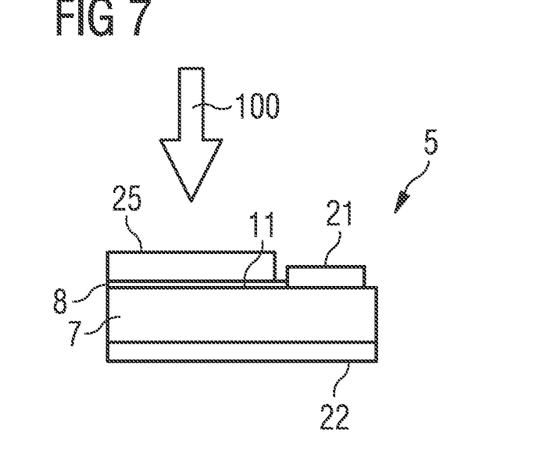
FIG. 7 schematically shows an exemplary embodiment of a semiconductor component.

FIG. 7 shows an exemplary embodiment of a wavelength-selective photodiode printable by means of micro-transfer printing as semiconductor component 5, the sensitive spectral range of which was adjusted by bandgap engineering.

The semiconductor component 5 comprises a substrate 7 and a first contact 21 on its upper side and a second contact 22 on its underside. These contacts 21, 22 may be n- or p-contacts. On the substrate upper side is provided a detection region 8 with the active zone 11 in which the incident light 100 is detected. A wavelength-selective layer 25 is applied to the detection region 8. By combining two materials, bandgap engineering can be achieved, for example, as follows: The detection region 8 is suitable for detecting radiation below a specific wavelength, referred to as Y by way of example. An absorption layer 25 absorbs radiation below a specific wavelength, referred to as X by way of example, so that this radiation no longer reaches the active zone 11. Consequently, only radiation in the wavelength range between Y and X is absorbed in the active zone 11 since radiation above the range cannot be detected and radiation below the range does not reach the detection region 8.

Figure 8:
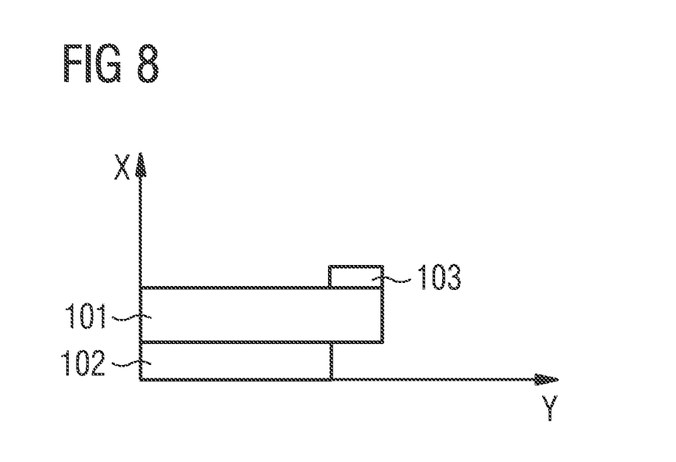
FIG. 8 illustrates the wavelength-dependent absorption behavior of the semiconductor component.

FIG. 8 illustrates the absorption behavior described above with reference to a representation of the absorption as a function of the wavelength. Although the wavelength range 101 below the wavelength Y can be detected in the detection region 8, only the difference range 103 between the wavelengths X and Y is detected and absorbed because of the shading of the radiation in the wavelength range 102 up to the wavelength X. The sensitivity of a semiconductor component 5 and its sensitive spectral range can be adjusted in a targeted manner by suitably combining various materials.

Various material combinations allow different sensitivities, which can be combined to form a spectrometer.

Figure 9:
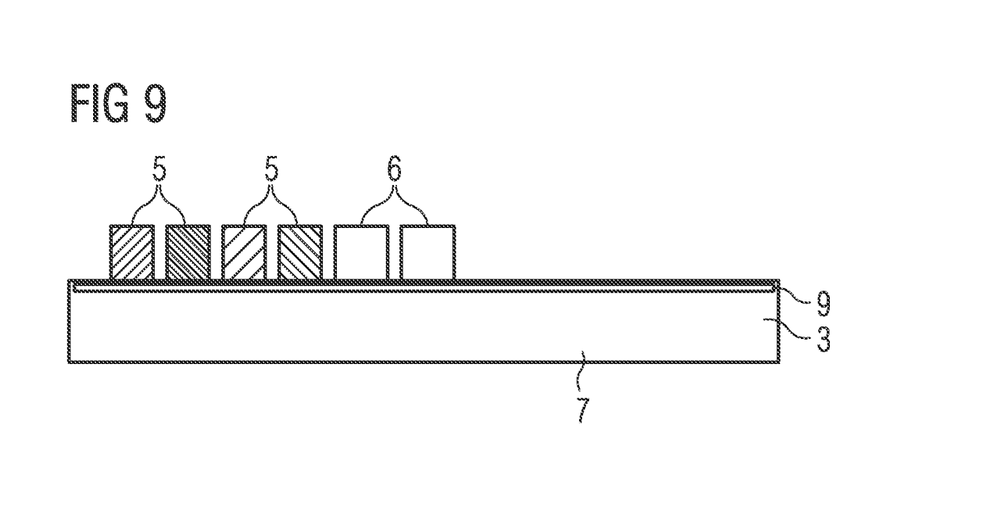
FIG. 9 schematically shows a further exemplary embodiment of a semiconductor device in sectional view.

FIG. 9 schematically shows a further exemplary embodiment of a semiconductor device in sectional view.

The semiconductor device 1 comprises a plurality of semiconductor components 5 on a device body 3 as described, for example, in connection with FIG. 1. In order to avoid repetitions, only the differences to FIG. 1 are described.

In addition to the microphotodiodes 5, this exemplary embodiment also comprises radiation-emitting semiconductor components 6 in order to form a sensor. Each radiation-emitting semiconductor component 6, which may be formed, for example, as LEDs, comprises an active zone for generating radiation and a breaking point, is arranged on the substrate, and is electrically conductively coupled to the device body 3. The radiation-emitting semiconductor components 6 are also printable components which were applied to the device body 3 by means of the micro-transfer printing described above.

The features of the exemplary embodiments can be combined. The invention is not limited by the description based on the exemplary embodiments. Rather, the invention comprises any new feature and any combination of features, which in particular comprises any combination of features in the claims, even if this feature or combination itself is not explicitly specified in the claims or exemplary embodiments.

LIST OF REFERENCE SIGNS

1 Semiconductor device
3 Device body
5 Semiconductor component
7 Substrate
8 Detection region
9 Integrated circuit
11 Active zone
13 Diffuser optical system 16 Optical system
21, 22 Contact
25 Absorption layer
30 Holding structure
32 Web
34 Anchor structure
38 Extension
40 Breaking point
52 Sacrificial substrate
54 Target substrate
55 Cell
100 Light
101, 102, 103 Range
X, Y Wavelength

The invention claimed is:

1. A method for manufacturing a semiconductor device, wherein the method comprises:
separating a multitude of semiconductor components from holding structures of a sacrificial wafer comprising the semiconductor components by pressing a stamp onto the semiconductor components to adhere to the semiconductor components and by breaking away webs or their attachments to the semiconductor components by moving the stamp into a direction away from the sacrificial wafer, leaving a breaking point directly on an outside of the semiconductor component, wherein each semiconductor component comprises an active zone configured to receive radiation;
transferring the multitude of semiconductor components from the sacrificial wafer to a target wafer comprising a plurality of device bodies coupled to each other, each device body comprising a substrate and an integrated circuit;
simultaneously placing the multitude of semiconductor components onto the plurality of device bodies by micro-transfer printing, such that the semiconductor components are coupled to the device bodies; and
arranging a diffuser or a refractive layer on the one or more semiconductor components.

2. A semiconductor device comprising:
a device body comprising a substrate and an integrated circuit,
a first and a second semiconductor component, wherein each semiconductor component comprises an active zone configured to receive radiation and a breaking point, wherein each semiconductor component is arranged on the device body, wherein each semiconductor component is electrically conductively coupled to the integrated circuit, and wherein a sensitive spectral range of the first semiconductor component differs from that of the second semiconductor component; and
a diffuser or a refractive layer arranged on the one or more semiconductor components.

3. The semiconductor device according to claim 2, wherein the semiconductor component or the plurality of semiconductor components was applied to the device body by micro-transfer printing.

4. The semiconductor device according to claim 2, wherein a material system of a first semiconductor component of the plurality of semiconductor components differs from that of a second semiconductor component of the plurality of semiconductor components.

5. The semiconductor device according to claim 4, wherein the different material systems comprise at least one of the group comprising silicon, germanium, III-V compounds, and II-IV compounds.

6. The semiconductor device according to claim 2, wherein the substrate of the device body comprises silicon.

7. The semiconductor device according to claim 2, wherein the device body comprises a transimpedance amplifier, an evaluation unit, or combinations thereof.

8. The semiconductor device according to claim 2, further comprising a layer that absorbs in a given wavelength range and is arranged on the semiconductor component or the plurality of semiconductor components or is applied to a detection region of the semiconductor component or to a detection region of at least one of the plurality of semiconductor components.

9. The semiconductor device according to claim 2, wherein a first set of semiconductor components of the plurality of semiconductor components is arranged in a first cell, wherein a second set of semiconductor components of the plurality of semiconductor components is arranged in a second cell, wherein at least the first cell and the second cell form an array of cells.

10. The semiconductor device according to claim 9, wherein the semiconductor components within the first cell or the second cell differ in their sensitive spectral ranges.

11. The semiconductor device according to claim 2, further comprising at least one active zone configured to generate radiation.

12. The semiconductor device according to claim 11, further comprising a further radiation-emitting semiconductor component or a plurality of further radiation-emitting semiconductor components, wherein further radiation-emitting semiconductor component comprises an active zone configured to generate radiation and a breaking point and is arranged on the device body and is electrically conductively coupled to the integrated circuit.

* * * * *